(12) United States Patent
Kim et al.

(10) Patent No.: US 11,441,071 B2
(45) Date of Patent: Sep. 13, 2022

(54) ETCHANT COMPOSITION AND METHODS FOR MANUFACTURING METAL PATTERN AND ARRAY SUBSTRATE USING THE SAME

(71) Applicant: Samsung Display Co., Ltd., Yongin-si (KR)

(72) Inventors: Bong-Kyun Kim, Hwaseong-si (KR); JinSeuk Kim, Suwon-si (KR); SeungBo Shim, Anyang-si (KR); ShinHyuk Choi, Suwon-si (KR); Seung-Hee Kim, Cheonan-si (KR); Donghee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 200 days.

(21) Appl. No.: 16/702,773

(22) Filed: Dec. 4, 2019

(65) Prior Publication Data
US 2020/0172807 A1    Jun. 4, 2020

(30) Foreign Application Priority Data

Dec. 4, 2018    (KR) .................. 10-2018-0154248

(51) Int. Cl.
*C09K 13/08*    (2006.01)
*H01L 29/45*    (2006.01)
(Continued)

(52) U.S. Cl.
CPC .............. *C09K 13/08* (2013.01); *C09K 13/00* (2013.01); *C09K 13/06* (2013.01); *C23F 1/02* (2013.01); *C23F 1/10* (2013.01); *C23F 1/16* (2013.01); *C23F 1/18* (2013.01); *C23F 1/26* (2013.01); *C23F 1/44* (2013.01); *G03F 7/2014* (2013.01); *H01L 21/30604* (2013.01); *H01L 21/31111* (2013.01); *H01L 21/3213* (2013.01); *H01L 21/32134* (2013.01); *H01L 27/1259* (2013.01); *H01L 29/458* (2013.01); *G02F 1/1368* (2013.01)

(58) Field of Classification Search
None
See application file for complete search history.

(56) References Cited

U.S. PATENT DOCUMENTS 9,023,735 B2    5/2015    Kim et al.
9,136,137 B2    9/2015    Kim et al.
(Continued)

FOREIGN PATENT DOCUMENTS

KR    10-2010-0040004    4/2010
KR    10-1146099    5/2012
(Continued)

*Primary Examiner* — Jiong-Ping Lu
(74) *Attorney, Agent, or Firm* — H.C. Park & Associates, PLC

(57) ABSTRACT

An etchant composition of an embodiment includes a persulfate, a four-nitrogen ring compound, a two-chlorine compound, a fluorine compound and water, and has a weight ratio of the four-nitrogen ring compound and the two-chlorine compound of about 1:0.5 to about 1:4. The etchant composition may etch a multilayer metal substrate of titanium/copper and may be used for manufacturing a multilayer metal pattern and an array substrate having excellent properties of etched patterns.

11 Claims, 6 Drawing Sheets

(51) Int. Cl.
    *H01L 21/3213*    (2006.01)
    *H01L 27/12*      (2006.01)
    *C23F 1/10*       (2006.01)
    *C23F 1/16*       (2006.01)
    *C09K 13/00*     (2006.01)
    *C23F 1/02*       (2006.01)
    *C23F 1/18*       (2006.01)
    *C23F 1/26*       (2006.01)
    *C23F 1/44*       (2006.01)
    *G03F 7/20*       (2006.01)
    *H01L 21/306*    (2006.01)
    *H01L 21/311*    (2006.01)
    *C09K 13/06*     (2006.01)
    *G02F 1/1368*    (2006.01)

(56) References Cited

U.S. PATENT DOCUMENTS 10,465,296 B2   11/2019   An et al.
2015/0087148 A1*  3/2015   Kim ........................ H01L 29/45
                                                    438/669

FOREIGN PATENT DOCUMENTS

| KR | 10-2013-0068112 | | 6/2013 | |
|----|-----------------|---|--------|---|
| KR | 20130079462 | * | 7/2013 | ............ C09K 13/04 |
| KR | 10-2014-0019108 | | 2/2014 | |
| KR | 10-1394133 | | 5/2014 | |
| KR | 10-2015-0033821 | | 4/2015 | |
| KR | 10-2015-0045331 | | 4/2015 | |
| KR | 10-2015-0082135 | | 7/2015 | |
| KR | 10-2017-0015703 | | 2/2017 | |
| KR | 10-2017-0016715 | | 2/2017 | |
| KR | 10-1728441 | | 4/2017 | |
| KR | 10-2017-0066299 | | 6/2017 | |
| KR | 10-1745721 | | 6/2017 | |
| WO | WO2015130607 | * | 9/2015 | ............ C22B 3/04 |

* cited by examiner

ETCHANT COMPOSITION AND METHODS FOR MANUFACTURING METAL PATTERN AND ARRAY SUBSTRATE USING THE SAME

CROSS REFERENCE TO RELATED APPLICATION

This application claims priority from and the benefit of Korean Patent Application No. 10-2018-0154248, filed on Dec. 4, 2018, which is hereby incorporated by reference for all purposes as if fully set forth herein.

BACKGROUND

Field

Exemplary embodiments of the invention relate generally to an etchant composition and methods for manufacturing a metal pattern and an array substrate using the same, and, more specifically, to an etchant composition provided for etching multiple metal layers and methods for manufacturing a metal pattern and an array substrate using the same.

In order to achieve the properties of high resolution, large-size, and 3D display in the flat display industry, the need for a quicker response time is on the rise. Particularly, in order to accomplish high resolution, the width of a metal pattern for a wire used in the circuit board of a display device must be decreased, and in this case, the height of the pattern is increased to control a resistance value. Accordingly, defects of inferior step coverage of stacked metal layers arise.

Discussion of the Background

Meanwhile, as a metal pattern material, eco-friendly copper having excellent electroconductivity is used, and to increase the adhesion with high resolution in a metal pattern using copper, a case of using another metal layer other than copper as a bottom layer is increasing. Accordingly, an etchant composition which may keep an appropriate taper angle for patterning a multilayer metal pattern including a copper layer, and which may perform batch type etching is required.

The above information disclosed in this Background section is only for understanding of the background of the inventive concepts, and, therefore, it may contain information that does not constitute prior art.

SUMMARY

One or more exemplary embodiments of the invention provide an etchant composition having excellent taper properties during patterning a multilayer metal pattern including copper.

One or more exemplary embodiments of the invention also provide a method for manufacturing a multilayer metal pattern having an excellent taper shape. In addition, one or more exemplary embodiments of the invention also provide a method for manufacturing an array substrate, by which wiring defects such as short circuits are decreased by forming a multilayer metal pattern having an excellent taper shape.

Additional features of the inventive concepts will be set forth in the description which follows, and in part will be apparent from the description, or may be learned by practice of the inventive concepts.

An embodiment of the inventive concepts provides an etchant composition including a persulfate; a four-nitrogen ring compound; a two-chlorine compound; a fluorine compound; and water, wherein a weight ratio of the four-nitrogen ring compound and the two-chlorine compound is from about 1:0.5 to about 1:4.

In an embodiment, the etchant composition may further include a hydrogen sulfate.

In an embodiment, the etchant composition may further include a sulfonic acid compound.

In an embodiment, the etchant composition may further include an antioxidant, an acidity regulator, a phosphate, and a copper salt.

In an embodiment, the etchant composition may further include a hydrogen sulfate and a sulfonic acid compound, and may include, based on a total weight of the etchant composition, from about 0.1 wt % to about 25 wt % of the persulfate; from about 0.5 wt % to about 1 wt % of the four-nitrogen ring compound; from about 0.5 wt % to about 2 wt % of the two-chlorine compound; from about 0.01 wt % to about 3 wt % of the fluorine compound; from about 0.05 wt % to about 8 wt % of the hydrogen sulfate; from about 0.1 wt % to about 10 wt % of the sulfonic acid compound; and a remaining amount of the water.

In an embodiment, the etchant composition may include, based on the total weight of the etchant composition, from about 0.001 wt % to about 3 wt % of the antioxidant; from about 0.1 wt % to about 0.9 wt % of the acidity regulator; from about 0.1 wt % to about 5 wt % of the phosphate; and from about 0.01 wt % to about 2 wt % of the copper salt.

In an embodiment, an acidity of the etchant composition may be from about 2.0 to about 6.0.

In an embodiment, the persulfate may include at least one of potassium persulfate ($K_2S_2O_8$), sodium persulfate ($Na_2S_2O_8$), or ammonium persulfate (($NH_4$)$_2S_2O_8$).

In an embodiment, the four-nitrogen ring compound may include at least one of aminotetrazole, aminotetrazole of potassium salt, or methyltetrazole.

In an embodiment, the two-chlorine compound may include at least one of magnesium chloride ($MgCl_2$), calcium chloride ($CaCl_2$), or copper chloride ($CuCl_2$).

In an embodiment, the fluorine compound may include at least one of hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$).

In an embodiment, the hydrogen sulfate may include at least one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$).

In an embodiment, the sulfonic acid compound may include at least one of methane sulfonic acid, benzene sulfonic acid, p-toluene sulfonic acid, ammonium sulfonic acid, amido sulfonic acid, a cyclic sulfonic acid compound, or a hydrocarbon-based sulfonic acid compound.

In an embodiment, the etchant composition may etch a multilayer metal pattern including a titanium metal layer and a copper metal layer.

In an embodiment of the inventive concepts, a method for manufacturing a metal pattern includes: forming a photosensitive layer pattern on a multilayer metal substrate including titanium and copper; providing an etchant composition on the multilayer metal substrate on which the photosensitive layer pattern is formed to form the metal pattern; and removing the photosensitive layer pattern, wherein the etchant composition includes a persulfate, a four-nitrogen ring compound, a two-chlorine compound, a fluorine compound, and water, and a weight ratio of the four-nitrogen ring compound and the two-chlorine compound is from about 1:0.5 to about 1:4.

In an embodiment, the multilayer metal substrate may include a first metal layer including titanium; and a second metal layer disposed on the first metal layer and including copper.

In an embodiment, the etchant composition may etch the first metal layer and the second metal layer in a batch process.

In an embodiment, the etchant composition may further include a hydrogen sulfate, a sulfonic acid compound, an antioxidant, an acidity regulator, a phosphate, and a copper salt, and the etchant composition may include, based on a total weight of the etchant composition, from about 0.1 wt % to about 25 wt % of the persulfate; from about 0.5 wt % to about 1 wt % of the four-nitrogen ring compound; from about 0.5 wt % to about 2 wt % of the two-chlorine compound; from about 0.01 wt % to about 3 wt % of the fluorine compound; from about 0.05 wt % to about 8 wt % of the hydrogen sulfate; from about 0.1 wt % to about 10 wt % of the sulfonic acid compound; from about 0.001 wt % to about 3 wt % of the antioxidant; from about 0.1 wt % to about 0.9 wt % of the acidity regulator; from about 0.1 wt % to about 5 wt % of the phosphate; from about 0.01 wt % to about 2 wt % of the copper salt; and a remaining amount of the water.

In an embodiment of the inventive concepts, a method for manufacturing an array substrate includes: forming a gate line and a gate electrode which is connected with the gate line, on a substrate; forming a data line which crosses the gate line in an insulation state, a source electrode which is connected with the data line, and a drain electrode which is separated from the source electrode; and forming a pixel electrode which is connected with the drain electrode, wherein the step of forming of the source electrode and the drain electrode which is separated from the source electrode includes forming a photosensitive layer pattern on a multilayer metal substrate including titanium and copper; providing an etchant composition on the multilayer metal substrate on which the photosensitive layer pattern is formed to form the source electrode and the drain electrode; and removing the photosensitive layer pattern, wherein the etchant composition includes a persulfate, a four-nitrogen ring compound, a two-chlorine compound, a fluorine compound, and water, and a weight ratio of the four-nitrogen ring compound and the two-chlorine compound is from about 1:0.5 to about 1:4

In an embodiment, the etchant composition may further include a hydrogen sulfate, a sulfonic acid compound, an antioxidant, an acidity regulator, a phosphate, and a copper salt, and the etchant composition may include, based on a total weight of the etchant composition, from about 0.1 wt % to about 25 wt % of the persulfate; from about 0.5 wt % to about 1 wt % of the four-nitrogen ring compound; from about 0.5 wt % to about 2 wt % of the two-chlorine compound; from about 0.01 wt % to about 3 wt % of the fluorine compound; from about 0.05 wt % to about 8 wt % of the hydrogen sulfate; from about 0.1 wt % to about 10 wt % of the sulfonic acid compound; from about 0.001 wt % to about 3 wt % of the antioxidant; from about 0.1 wt % to about 0.9 wt % of the acidity regulator; from about 0.1 wt % to about 5 wt % of the phosphate; from about 0.01 wt % to about 2 wt % of the copper salt; and a remaining amount of the water.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
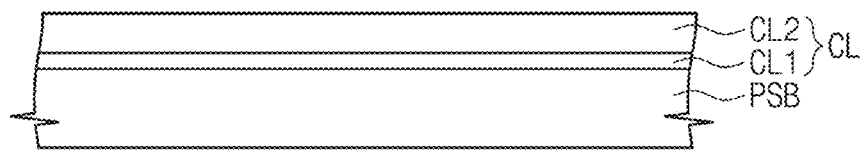
FIGS. 1A, 1B, 1C, 1D, and 1E are cross-sectional views showing steps of a method for manufacturing a metal pattern of an embodiment using an etchant composition of an embodiment.
Figure 1A:
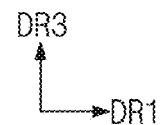

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are, with the exception of the electron scanning microscopic images, schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an etchant composition according to an exemplary embodiment of the inventive concepts will be explained.

The etchant composition according to an embodiment of the inventive concepts may be used for etching a metal layer to form a metal pattern. The etchant composition according to an embodiment of the inventive concepts may be used for etching a multilayer metal pattern including copper and titanium. For example, the etchant composition of an embodiment may be used for etching a multilayer metal substrate in which a titanium metal layer including titanium and a copper metal layer including copper are stacked to form a metal pattern. Particularly, the multilayer metal pattern may be a double layer in which a titanium metal layer and a copper metal layer are stacked in order.

The etchant composition of an embodiment may include a persulfate, a four-nitrogen ring compound, a two-chlorine compound, a fluorine compound, and water.

In the etchant composition of an embodiment, the persulfate is a main oxidant and may be an etchant for etching a metal layer including copper. However, embodiments of the inventive concepts are not limited thereto, and the persulfate may etch a metal layer including titanium.

The persulfate may be included in an amount of about 0.1 wt % to about 25 wt % based on the total weight of the etchant composition. For example, the persulfate may be included in an amount of about 0.5 wt % to about 20 wt % based on the total weight of the etchant composition. Particularly, the persulfate may be included in an amount of about 1 wt % to about u) 18 wt % based on the total weight of the etchant composition, and more particularly, the persulfate may be included in an amount of about 5 wt % to about 15 wt % based on the total weight of the etchant composition.

If the amount of the persulfate is greater than about 25 wt %, the etching rate of a metal layer using the etchant composition of an embodiment may be excessively fast, and the control of an etching degree may be difficult, and thus, a metal layer including copper may be overetched. In addition, if the amount of the persulfate is less than about 0.1 wt %, an etching rate may decrease, and etching may be carried out insufficiently.

The persulfate may be potassium persulfate ($K_2S_2O_8$), sodium persulfate ($Na_2S_2O_8$), or ammonium persulfate (($NH_4$)$_2S_2O_8$). The etchant composition of an embodiment may include at least one of potassium persulfate, sodium persulfate, or ammonium persulfate as the persulfate. That is, the etchant composition of an embodiment may include any one, or two or more among the potassium persulfate, the sodium persulfate, and the ammonium persulfate as the persulfate.

The etchant composition of an embodiment includes a four-nitrogen ring compound. The four-nitrogen ring compound may prevent the corrosion of copper and may stably keep the surface profile of copper etched. The four-nitrogen ring compound means a compound including four nitrogen atoms among the atoms forming a ring.

The four-nitrogen ring compound may be included in an amount of about 0.5 wt % to about 1 wt % based on the total weight of the etchant composition. For example, the etchant composition of an embodiment may include the four-nitrogen ring compound in an amount of about 0.5 wt % to about 0.8 wt % based on the total weight of the etchant composition. Particularly, the etchant composition of an embodiment may include the four-nitrogen ring compound in an amount of about 0.6 wt % to about 0.7 wt % based on the total weight of the etchant composition.

If the amount of the four-nitrogen ring compound is greater than about 1 wt %, an etching rate may decrease due to the influence of the excessive amount of the four-nitrogen ring compound, and the processability of an etching process using the etchant composition of an embodiment may be deteriorated. In addition, if the amount of the four-nitrogen ring compound is less than about 0.5 wt %, the etching rate of a metal layer including copper may excessively increase, and the control of the etching degree of the metal layer may become difficult.

The four-nitrogen ring compound may be a substituted or unsubstituted tetrazole compound. For example, the four-nitrogen ring compound may be a substituted or unsubstituted tetrazole or a substituted or unsubstituted tetrazole salt. Particularly, the four-nitrogen ring compound may be aminotetrazole, aminotetrazole of potassium salt, or methyltetrazole. The etchant composition of an embodiment may include at least one of aminotetrazole, aminotetrazole of potassium salt, or methyltetrazole as the four-nitrogen ring compound. That is, the etchant composition of an embodiment may include any one, or two or more among aminotetrazole, aminotetrazole of potassium salt, and methyltetrazole as the four-nitrogen ring compound.

The etchant composition of an embodiment includes a two-chlorine compound. The two-chlorine compound may control the etching rate of a metal layer. The two-chlorine compound may be used for controlling a taper shape, etc., during pattering a metal layer. The two-chlorine compound may increase a taper angle and restrain the corrosion of a metal pattern. The two-chlorine compound means a chloride including two chlorine (Cl) atoms.

The two-chlorine compound may be included in an amount of about 0.5 wt % to about 2 wt % based on the total weight of the etchant composition. For example, the etchant composition of an embodiment may include the two-chlorine compound in an amount of about 0.6 wt % to about 1.5 wt % based on the total weight of the etchant composition. Particularly, the etchant composition of an embodiment may include the two-chlorine compound in an amount of about 0.7 wt % to about 1.0 wt % based on the total weight of the etchant composition.

If the amount of the two-chlorine compound is greater than about 2 wt %, overetching may arise and problems including the loss of a patterned metal wiring or the excessive increase of a taper angle may arise. In addition, if the amount of the two-chlorine compound is less than about 0.5 wt %, the etching rate of a metal layer including copper may decrease, and a metal pattern formed may not have a desired profile.

The two-chlorine compound may be magnesium chloride ($MgCl_2$), calcium chloride ($CaCl_2$), or copper chloride ($CuCl_2$). The etchant composition of an embodiment may include at least one of magnesium chloride ($MgCl_2$), calcium chloride ($CaCl_2$), or copper chloride ($CuCl_2$). For example, the etchant composition of an embodiment may include, as the two-chlorine compound, one among magnesium chloride ($MgCl_2$), calcium chloride ($CaCl_2$), and copper chloride ($CuCl_2$), or a mixture of two or more thereof.

The etchant composition of an embodiment includes a fluorine compound. The fluorine compound means a fluoride including a fluorine (F) atom. The fluorine compound may be an etchant for etching a metal layer including titanium. However, embodiments of the inventive concepts are not limited thereto, and the fluorine compound may also etch a metal layer including copper.

The fluorine compound may be included in an amount of about 0.01 wt % to about 3 wt % based on the total weight of the etchant composition. For example, the etchant composition of an embodiment may include the fluorine compound in an amount of about 0.01 wt % to about 1 wt % based on the total weight of the etchant composition. Particularly, the etchant composition of an embodiment may include the fluorine compound in an amount of about 0.05 wt % to about 0.7 wt % based on the total weight of the etchant composition.

If the amount of the fluorine compound is greater than about 3 wt %, a metal layer including titanium may be overetched, and accordingly, undercut may be generated at the bottom of a metal layer including titanium, and defects of additionally etching an insulating layer or a substrate under the metal layer may arise. In addition, if the amount of the fluorine compound is less than about 0.01 wt %, the etching of a metal layer including titanium may become impossible.

The fluorine compound may be hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$). The etchant composition of an embodiment may include at least one of hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$) as a fluorine compound. For example, the etchant composition of an embodiment may include any one among hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), and sodium bifluoride ($NaHF_2$), or a mixture of or two or more thereof as the fluorine compound.

In the etchant composition of an embodiment, the four-nitrogen ring compound and the two-chlorine compound may be included in a weight ratio of about 1:0.5 to about 1:4. In the etchant composition of an embodiment, the four-nitrogen ring compound and the two-chlorine compound are included in a weight ratio of about 1:0.5 to about 1:4 and may restrain the generation of an insoluble precipitate during an etching process. That is, if the weight ratio of the four-nitrogen ring compound and the two-chlorine compound is less than about 1:0.5 or greater than about 1:4, copper ions ($Cu^{2+}$) produced during an etching process may produce an insoluble precipitate, and problems of the corrosion of a metal layer pattern by the precipitate and resultant short may arise.

The etchant composition of an embodiment may further include a hydrogen sulfate. The hydrogen sulfate may be used as a stabilizer in the etchant composition of an embodiment. In an embodiment, the hydrogen sulfate may be used as the stabilizer of a persulfate. For example, the hydrogen sulfate may play the role of preventing the decrease of etching performance due to the decomposition of the persulfate according to the progress of etching. That is, the hydrogen sulfate decreases the decomposition rate of the persulfate, and may play the role of keeping the etching rate of a metal layer including copper in an etching process using the etchant composition of an embodiment constant.

In the etchant composition of an embodiment, the hydrogen sulfate may be included in an amount of about 0.05 wt % to about 8 wt % based on the total weight of the etchant composition. For example, the etchant composition of an embodiment may include the hydrogen sulfate in an amount of about 0.1 wt % to about 5 wt % based on the total weight of the etchant composition. Particularly, the etchant composition of an embodiment may include the hydrogen sulfate in an amount of about 0.5 wt % to about 3 wt % based on the total weight of the etchant composition.

If the amount of the hydrogen sulfate is greater than about 8 wt %, the control of an etching rate is difficult, the etching rate of a metal layer including copper increases excessively, and corrosion defects may be generated. In addition, if the amount of the hydrogen sulfate is less than about 0.05 wt %, the decomposition suppressing effect of the persulfate may not be shown and the stability of the etchant composition of an embodiment may be deteriorated.

In Table 1 below, the stability of an etchant composition according to the addition or not of a hydrogen sulfate is compared and shown. In Table 1 below, the configurations of the etchant compositions of Example A and Comparative Example A are the same except for the addition or not of the hydrogen sulfate. Table 1 shows the change of the amount of the hydrogen sulfate in an etchant composition in accordance with the lapse of time. In Table 1, the amount of the hydrogen sulfate corresponds to wt %.

TABLE 1

| Elapsed time | 0 hr | 24 hr | 48 hr | 72 hr | 144 hr | 216 hr |
|---|---|---|---|---|---|---|
| Example A | 10.0 | 8.5 | 7.8 | 7.0 | 5.1 | 3.9 |
| Comparative Example A | 10.0 | 6.9 | 4.9 | 4.4 | 3.5 | 3.1 |

That is, referring to Table 1, when comparing Comparative Example A in which a hydrogen sulfate was not included with Example A, the amount of the persulfate was relatively significantly decreased according to the lapse of time, and from the results, it may be found that the hydrogen sulfate lowered the decomposition rate of the persulfate to improve the stability of the etchant composition.

Meanwhile, each of the etchant compositions of Example A and Comparative Example A may include about 10 wt % of the persulfate, about 0.7 wt % of the four-nitrogen ring compound, about 1 wt % of the two-chlorine compound, about 0.45 wt % of the fluorine compound, about 1 wt % of the hydrogen sulfate, about 8 wt % of the sulfonic acid compound, about 0.3 wt % of the antioxidant, about 0.5 wt % of the acidity regulator, about 0.2 wt % of the phosphate, about 0.15 wt % of the copper salt compound and a remaining amount of water.

The hydrogen sulfate may be ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$). The etchant composition of an embodiment may include at least one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$). For example, the etchant composition of an embodiment may include any one among ammonium hydrogen sulfate ($NH_4HSO_4$), lithium hydrogen sulfate ($LiHSO_4$), potassium hydrogen sulfate ($KHSO_4$), and sodium hydrogen sulfate ($NaHSO_4$), or a mixture of two or more thereof as the hydrogen sulfate.

The etchant composition of an embodiment may further include a sulfonic acid compound. The sulfonic acid compound may be used as an auxiliary oxidant. The sulfonic acid compound may play the role of a buffer for supplementing the oxidizing power which is decreased according to the progress of an etching process and for keeping an etching rate in the etchant composition of an embodiment.

In the etchant composition of an embodiment, the sulfonic acid compound may be included in an amount of about 0.1 wt % to about 10 wt % based on the total weight of the etchant composition. For example, the etchant composition of an embodiment may include the sulfonic acid compound in an amount of about 0.5 wt % to about 7 wt % based on the total weight of the etchant composition. Particularly, the etchant composition of an embodiment may include the sulfonic acid compound in an amount of about 1 wt % to about 5 wt % based on the total weight of the etchant composition.

If the amount of the sulfonic acid compound is greater than about 10 wt %, the concentration of copper ions may change according to the progress of an etching process, and thus, phenomenon of gradually increasing an etching rate may arise. In addition, if the amount of the sulfonic acid compound is less than about 0.1 wt %, an etching rate may decrease according to the progress of an etching process, and thus, etching performance may be deteriorated.

The sulfonic acid compound may include sulfamic acid ($H_3NSO_3$), ammonium sulfonic acid, a cyclic sulfonic acid compound, or a hydrocarbon-based sulfonic acid compound. The etchant composition of an embodiment may include at least one of sulfamic acid, ammonium sulfonic acid, a cyclic sulfonic acid compound, or a hydrocarbon-based sulfonic acid compound.

In addition, the cyclic sulfonic acid compound may be a cyclic sulfonic acid compound of 1 to 20 carbon atoms. In case of a cyclic sulfonic acid compound of greater than 20 carbon atoms, problems of decreasing the solubility thereof in the etchant composition may arise. If a solid fraction is present in the etchant composition due to the decrease of the solubility, problems of degrading etching quality including the generation of an unetched part, may arise. For example, the carbon number of the cyclic sulfonic acid compound may be 2 to 10, and more particularly, the carbon number of the cyclic sulfonic acid compound may be 3 to 6. The cyclic sulfonic acid compound may include propane sultone, butane sultone, or propene sultone.

The carbon number of the hydrocarbon-based sulfonic acid compound may be 1 to 20. In case of the hydrocarbon-based sulfonic acid compound of greater than 20 carbon atoms, problems of degrading the solubility in an etchant composition may arise. For example, the carbon number of the hydrocarbon-based sulfonic acid compound may be 2 to 10, and more particularly, the carbon number of the hydrocarbon-based sulfonic acid compound may be 3 to 7. The hydrocarbon-based sulfonic acid may include methane sulfonic acid ($CH_3SO_3H$), ethane sulfonic acid ($CH_3CH_2SO_3H$), benzene sulfonic acid ($C_6H_5SO_3H$), or p-toluene sulfonic acid (p-$CH_3C_6HSO_3H$).

The etchant composition of an embodiment may include any one among sulfamic acid, ammonium sulfonic acid, propane sultone, butane sultone, propene sultone, methane sulfonic acid, ethane sulfonic acid, benzene sulfonic acid, and toluene sulfonic acid, or a mixture of two or more thereof, as the sulfonic acid compound.

The etchant composition of an embodiment may further include an antioxidant, an acidity regulator, a phosphate, and a copper salt. That is, the etchant composition of an embodiment may further include a persulfate, a four-nitrogen ring compound, a two-chlorine compound, a fluorine compound, a hydrogen sulfate, a sulfonic acid compound, an antioxidant, an acidity regulator, a phosphate, a copper salt, and a remaining amount of water.

In the etchant composition of an embodiment, the antioxidant may play the role of suppressing the production of an insoluble precipitate. The antioxidant may suppress the production of an insoluble precipitate which is produced by the reaction of the four-nitrogen ring compound and the two-chlorine compound with copper ions ($Cu^{2\pm}$). Meanwhile, in the etchant composition of an embodiment, the antioxidant may mean a compound used as the antioxidant itself or the salts thereof.

The etchant composition of an embodiment may include the antioxidant in about 0.001 wt % to about 3 wt % based on the total weight of the etchant composition. For example, the etchant composition of an embodiment may include the antioxidant in about 0.005 wt % to about 2 wt % based on the total weight of the etchant composition. Particularly, the etchant composition of an embodiment may include the antioxidant in about 0.01 wt % to about 1 wt % based on the total weight of the etchant composition.

If the amount of the antioxidant is greater than about 3 wt %, etching ability may be deteriorated and the process time of an etching process may increase. In addition, if the amount of the antioxidant is less than about 0.001 wt %, an insoluble precipitate may be produced.

For example, the antioxidant may include at least one among ascorbic acid, glutathione, lipoic acid, uric acid, and the salts thereof. The salts of the antioxidant may be the potassium salts, sodium salts, or ammonium salts of the antioxidant. The etchant composition of an embodiment may include one among ascorbic acid, glutathione, lipoic acid, uric acid, and the salts thereof, or a mixture of two or more thereof as the antioxidant.

The phosphate included in the etchant composition of an embodiment is a galvanic controller between copper and titanium, and may decrease the transporting rate of electrons from a metal layer including titanium to a metal layer including copper and decrease critical dimension (CD) skew due to overetching and decrease a taper angle.

The etchant composition of an embodiment may include the phosphate in an amount of about 0.1 wt % to about 5 wt % based on the total weight of the etchant composition. For example, the etchant composition of an embodiment may include the phosphate in an amount of about 0.3 wt % to about 3 wt % based on the total weight of the etchant composition. Particularly, the etchant composition of an embodiment may include the phosphate in an amount of about 0.5 wt % to about 2 wt % based on the total weight of the etchant composition.

If the amount of the phosphate is greater than about 5 wt %, CD skew in the metal pattern thus formed may decrease and the taper angle of the metal pattern may decrease, but problems of increasing the tail of the edge portion of the metal layer including titanium may arise. In addition, if the amount of the phosphate is less than about 0.1 wt %, effects of decreasing the CD skew and the taper angle may not be achieved.

In an embodiment, the phosphate may include at least one of monoammonium phosphate ($NH_4H_2PO_4$), monosodium phosphate ($NaH_2PO_4$), or monopotassium phosphate ($KH_2PO_4$). For example, the etchant composition of an embodiment may include one of monoammonium phosphate ($NH_4H_2PO_4$), monosodium phosphate ($NaH_2PO_4$), or monopotassium phosphate ($KH_2PO_4$), or a mixture of two or more thereof as the phosphate compound.

The acidity regulator included in the etchant composition of an embodiment may control the acidity of the whole etchant composition. In an embodiment, an inorganic acid compound may be used as the acidity regulator. For example, an inorganic compound such as nitric acid ($HNO_3$), and sulfuric acid ($H_2SO_4$) may be used as the acidity regulator. The etchant composition of an embodiment may include at least one of nitric acid ($HNO_3$), or sulfuric acid ($H_2SO_4$), or a mixture thereof.

The acidity regulator may be included in about 0.1 wt % to about 0.9 wt % based on the total weight of the etchant composition. For example, the etchant composition of an embodiment may include the acidity regulator in an amount of about 0.1 wt % to about 0.7 wt % based on the total weight of the etchant composition. Particularly, the etchant composition of an embodiment may include the acidity regulator in an amount of about 0.3 wt % to about 0.5 wt % based on the total weight of the etchant composition.

If the amount of the acidity regulator is greater than about 0.9 wt %, the acidity of the whole etchant composition may increase, and the action as the antioxidant may not be controlled, and if the amount of the acidity regulator is less than about 0.1 wt %, the acidity of the whole etchant composition may decrease, and a precipitate may be produced.

The copper salt included in the etchant composition of an embodiment may be used to control the increase of initial CD skew due to the two-chlorine compound. For example, the copper salt may include one of copper sulfate, copper nitrate, or copper chloride, or a mixture of two or more thereof. The etchant composition of an embodiment may include the copper salt in about 0.01 wt % to about 2 wt % based on the total weight of the etchant composition. For example, the etchant composition of an embodiment may include the copper salt in about 0.05 wt % to about 0.1 wt % based on the total weight of the etchant composition. Particularly, the etchant composition of an embodiment may include the copper salt in about 0.05 wt % to about 0.5 wt % based on the total weight of the etchant composition.

If the amount of the copper salt is greater than about 2 wt %, the decomposition of the persulfate may be accelerated and the storage stability of the etchant composition may become weak. In addition, if the amount of the copper salt is less than about 0.01 wt %, initial CD skew phenomenon due to the two-chlorine compound may not be suppressed.

Meanwhile, the etchant composition of an embodiment includes water, and water may be included in the etchant composition so that the sum of the compounds constituting the etchant composition and water becomes 100 wt %. That is, though not clearly mentioned in the inventive concepts, water may be included such that the total of the sum of the wt % of remaining components other than water in the whole etchant composition and the wt % of water becomes 100 wt %. Accordingly, water occupies the remaining portion from the sum of the wt % of the other components excluding water in the whole etchant composition. Water used in the etchant composition of an embodiment may be water having the degree for a semiconductor, or ultrapure water.

The etchant composition of an embodiment may include from about 0.1 wt % to about 25 wt % of the persulfate, from about 0.5 wt % to about 1 wt % of the four-nitrogen ring compound, from about 0.5 wt % to about 2 wt % of the two-chlorine compound, from about 0.01 wt % to about 3 wt % of the fluorine compound, from about 0.05 wt % to about 8 wt % of the hydrogen sulfate, from about 0.1 wt % to about 10 wt % of the sulfonic acid compound, from about 0.001 wt % to about 3 wt % of the antioxidant, from about 0.1 wt % to about 0.9 wt % of the acidity regulator, from about 0.1 wt % to about 5 wt % of the phosphate, from about 0.01 wt % to about 2 wt % of the copper salt, and a remaining amount of the water.

The etchant composition of an embodiment is used in a process for manufacturing an electronic apparatus, for example, in a process for forming a metal pattern by etching a stacked metal layer during manufacturing an electronic apparatus. Particularly, the etchant composition according to an embodiment may be used in a process for manufacturing an array substrate in a process for manufacturing a display device, and particularly, may be used for forming source drain electrodes, etc. by etching a double layer composed of titanium and copper.

The etchant composition of an embodiment is a non-hydrogen peroxide-based etchant composition which includes a persulfate as a main component, and a metal pattern manufactured by an etching process using the etchant composition of an embodiment shows excellent etching properties including small CD skew and a small taper angle. In addition, the etchant composition of an embodiment may be used for etching a multilayer metal pattern in which a titanium layer and a copper layer are stacked in a batch type, and may minimize the generation of a precipitate during an etching process.

Hereinafter, the method for manufacturing a metal pattern and the method for manufacturing an array substrate according to exemplary embodiments of the inventive concepts will be explained.

FIG. 1A to FIG. 1E are cross-sectional views showing a method for manufacturing a metal pattern using an etchant composition of an embodiment in order. FIG. 1A to FIG. 1E schematically show the cross-sections in a plane which is parallel to a plane defined by a third directional axis DR3 which is a thickness direction and a first directional axis DR1 which is orthogonal to the third directional axis DR3.

The method for manufacturing a metal pattern of an embodiment may include a step of forming a photosensitive layer pattern on a multilayer metal substrate including titanium and copper, a step of supplying an etchant composition on the multilayer metal substrate on which the photosensitive layer pattern is formed to form a multilayer metal pattern, and a step of removing the photosensitive layer pattern.

Figure 1B:
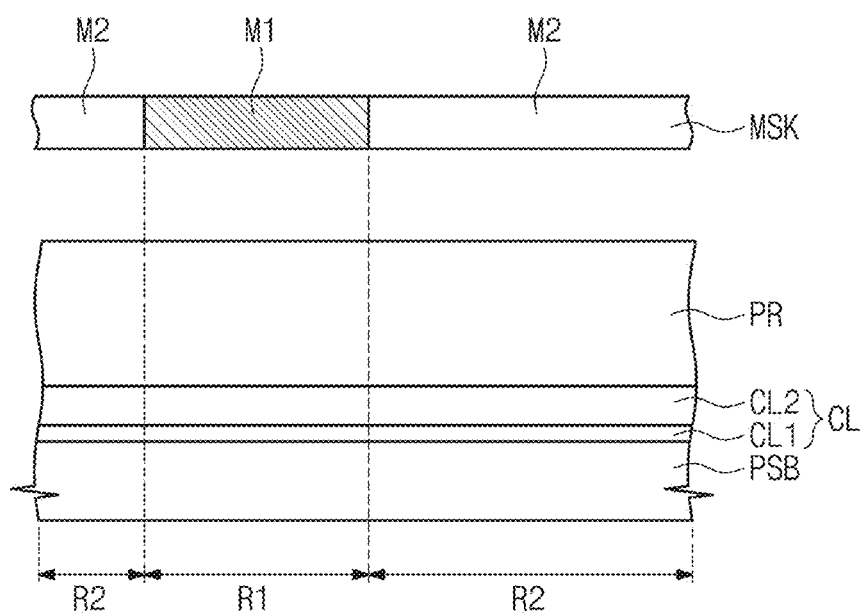
Figure 1B:
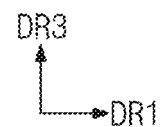
Figure 1C:
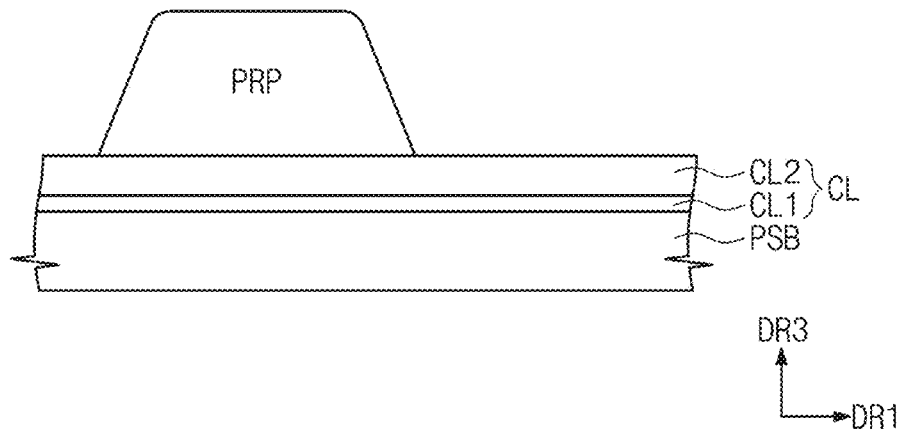

FIGS. 1A to 1C may show a step of forming a photosensitive layer pattern on a multilayer metal substrate including titanium and copper in the method for manufacturing a metal pattern of an embodiment. The step of forming a photosensitive layer pattern on a multilayer metal substrate including titanium and copper may include a step of forming a multilayer metal substrate including titanium and copper on a substrate, and forming a photosensitive layer pattern on the multilayer metal substrate.

FIG. 1A may show a step of forming a multilayer CL including titanium and copper on a substrate PSB. FIG. 1A shows a step of providing a first metal layer CL1 and a second metal layer CL2 on the substrate PSB, and the first metal layer CL1 may be a metal layer including titanium and the second metal layer CL2 may be a metal layer including copper. Meanwhile, FIG. 1A shows a double layer in which the first metal layer CL1 and the second metal layer CL2 are stacked in order, but embodiments of the inventive concepts are not limited thereto. The multilayer metal substrate including titanium and copper may be a single layer formed using an alloy including titanium and copper, or a multilayer of three or more, in which a titanium metal layer and a copper metal layer are alternately stacked.

Figure 3:
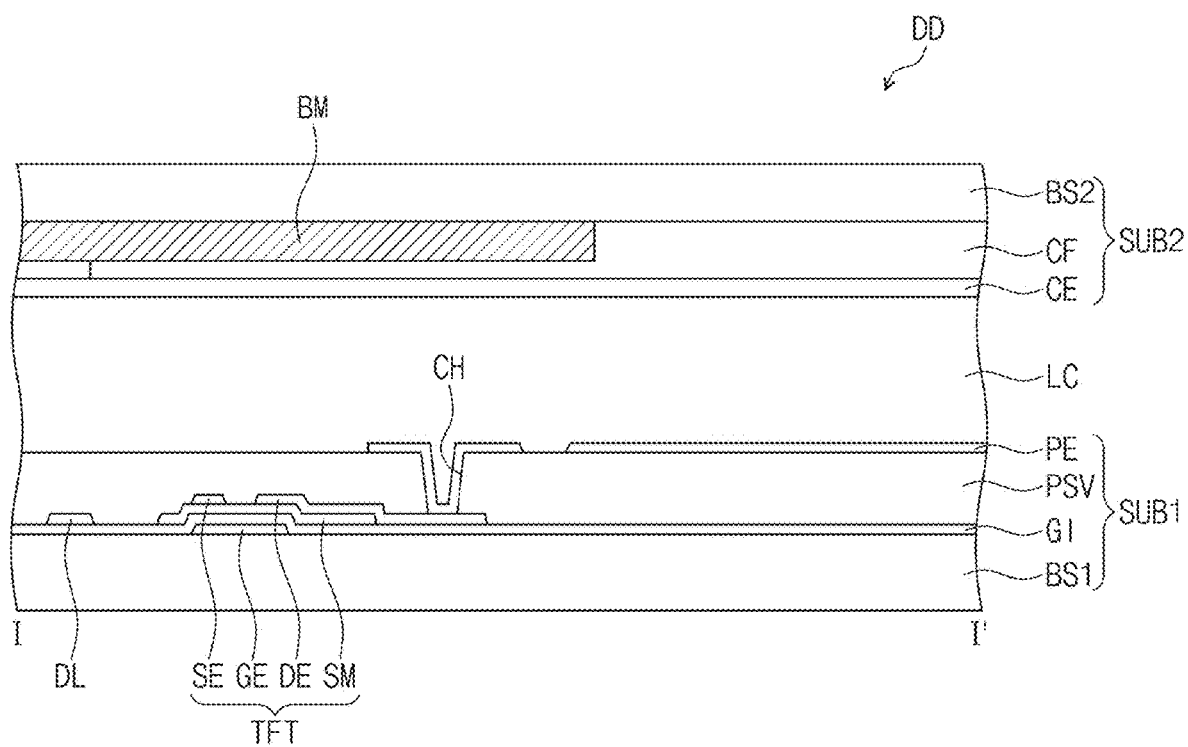
FIG. 3 is a cross-sectional view taken along line I-I' in FIG. 2.

Meanwhile, the substrate PSB may be an insulating substrate. Alternatively, the substrate PSB may be an array substrate during a manufacturing process in an embodiment. For example, the substrate PSB may be an incomplete array substrate, and may be an array substrate in an intermediate step, which is obtained by forming a partial circuit layer on a base substrate. Particularly, the substrate PSB may show a portion of an array substrate SUB1 (FIG. 3) in a display device of an embodiment, which will be explained later. For example, the substrate PSB may represent a substrate in a state where a semiconductor pattern SM (FIG. 3) is formed on a first base substrate BS1 (FIG. 3).

After forming a multilayer CL on the substrate PSB as shown in FIG. 1A, a photosensitive layer PR is provided on the whole surface of the multilayer CL which is formed on the substrate PSB, and the photosensitive layer PR is exposed through a mask MSK, as shown in FIG. 1B.

The mask MSK may be composed of a first part M1 which blocks all irradiated light, and a second part M2 which transmits a portion of light and blocks a portion of light. The substrate PSB and the multilayer CL may be divided into a first region R1 and a second region R2, which correspond to the first part M1 and the second part M2, respectively.

Then, after developing the exposed photosensitive layer PR through the mask MSK, as shown in FIG. 1C, a photosensitive layer pattern PRP with a certain thickness may remain on the first region R1, to which light is not supplied due to the blocking by the mask MSK, and the photosensitive layer may be completely removed in the second region R2, to which light passes through the second part M2 of the mask MSK to expose the surface of the substrate PSB. Meanwhile, in the explanation referring to FIG. 1B and FIG. 1C, a case of using a positive photosensitive solution for removing an exposed part of the photosensitive layer, is explained as an embodiment, but embodiments of the inventive concepts are not limited thereto. In an embodiment, a negative photosensitive solution for removing an unexposed part of the photosensitive layer may be used.

Figure 1D:
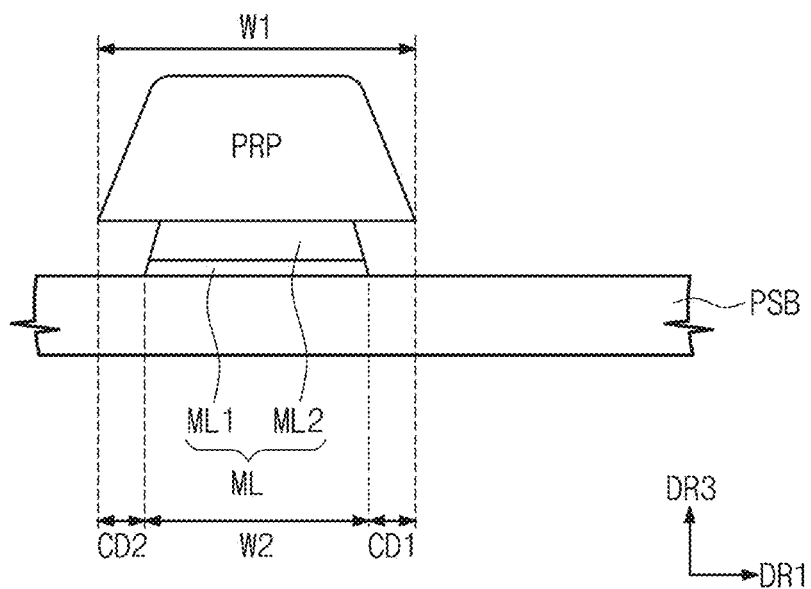

Next, the first metal layer CL1 and the second metal layer CL2 may be patterned using the photosensitive layer pattern PRP. The photosensitive layer pattern PRP may be used as a mask layer for patterning the multilayer CL. That is, as shown in FIG. 1C, an etchant composition (not shown) may be supplied on the multilayer CL on which the photosensitive layer pattern PRP is formed, and by the supplied etchant composition, the multilayer CL on which the photosensitive layer pattern PRP is not formed may be etched to form a metal pattern ML as shown in FIG. 1D. The metal pattern ML may include a first metal pattern ML1 and a second metal pattern ML2. In an embodiment, the first metal pattern ML1 may be a titanium metal layer, and the second metal pattern ML2 may be a copper metal layer.

The etchant composition supplied in the method for manufacturing a metal pattern of an embodiment may include a persulfate, a four-nitrogen ring compound, a two-chlorine compound, a fluorine compound, and water. The etchant composition used in the method for manufacturing a metal pattern of an embodiment may include a persulfate, a four-nitrogen ring compound, a two-chlorine compound, a fluorine compound, a hydrogen sulfate, a sulfonic acid compound, an antioxidant, an acidity regulator, a phosphate, a copper salt, and a remaining amount of water. The etchant composition used in the method for manufacturing a metal pattern of an embodiment may include from about 0.1 wt % to about 25 wt % of the persulfate, from about 0.5 wt % to about 1 wt % of the four-nitrogen ring compound, from about 0.5 wt % to about 2 wt % of the two-chlorine compound, from about 0.01 wt % to about 3 wt % of the fluorine compound, from about 0.05 wt % to about 8 wt % of the hydrogen sulfate, from about 0.1 wt % to about 10 wt % of the sulfonic acid compound, from about 0.001 wt % to about 3 wt % of the antioxidant, from about 0.1 wt % to about 0.9 wt % of the acidity regulator, from about 0.1 wt % to about 5 wt % of the phosphate compound, from about 0.01 wt % to about 2 wt % of the copper salt, and a remaining amount of the water.

The etchant composition of an embodiment may etch the first metal layer CL1 and the second metal layer CL2 in a batch type to form the metal pattern ML.

Figure 1E:
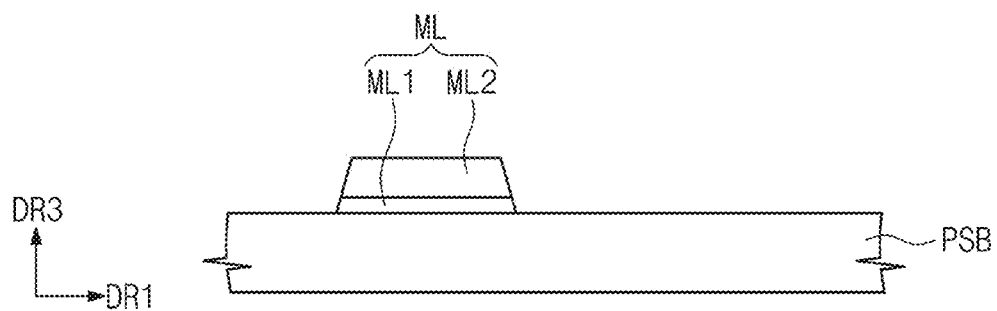

Referring to FIG. 1D and FIG. 1E, the photosensitive layer pattern PRP and the metal pattern ML may have a trapezoidal shape on a cross-section defined by the first directional axis DR1 and the third directional axis DR3. However, embodiments of the inventive concepts are not limited thereto.

Meanwhile, the maximum width W2 of the metal pattern ML may be smaller than the maximum width W1 of the photosensitive layer pattern PRP on the cross-section. Meanwhile, in an etching process using the photosensitive layer pattern PRP, a difference (W1-W2) between the maximum width W1 of the photosensitive layer pattern PRP and the maximum width W2 of the metal pattern ML is defined as critical dimension (CD) skew, and in FIG. 1D, "CD1" or "CD2" corresponds to one side CD skew.

After forming the metal pattern ML using the photosensitive layer pattern PRP, the photosensitive layer pattern PRP may be removed. FIG. 1E shows a final metal pattern ML after removing the photosensitive layer pattern PRP. The metal pattern ML may be a multilayer metal pattern in which a titanium metal pattern and a copper metal pattern are stacked.

In the method for manufacturing a metal pattern according to an embodiment of the present invention, a metal pattern composed of a first metal and a second metal, that is, a titanium/copper double layer metal pattern may be manufactured. In the explanation referring to FIG. 1A to FIG. 1E, a method for forming a metal pattern composed of a plurality of layers is explained, but embodiments of the inventive concepts are not limited thereto. A metal pattern formed of a single layer including copper may also be manufactured by substantially the same method.

Figure 2:
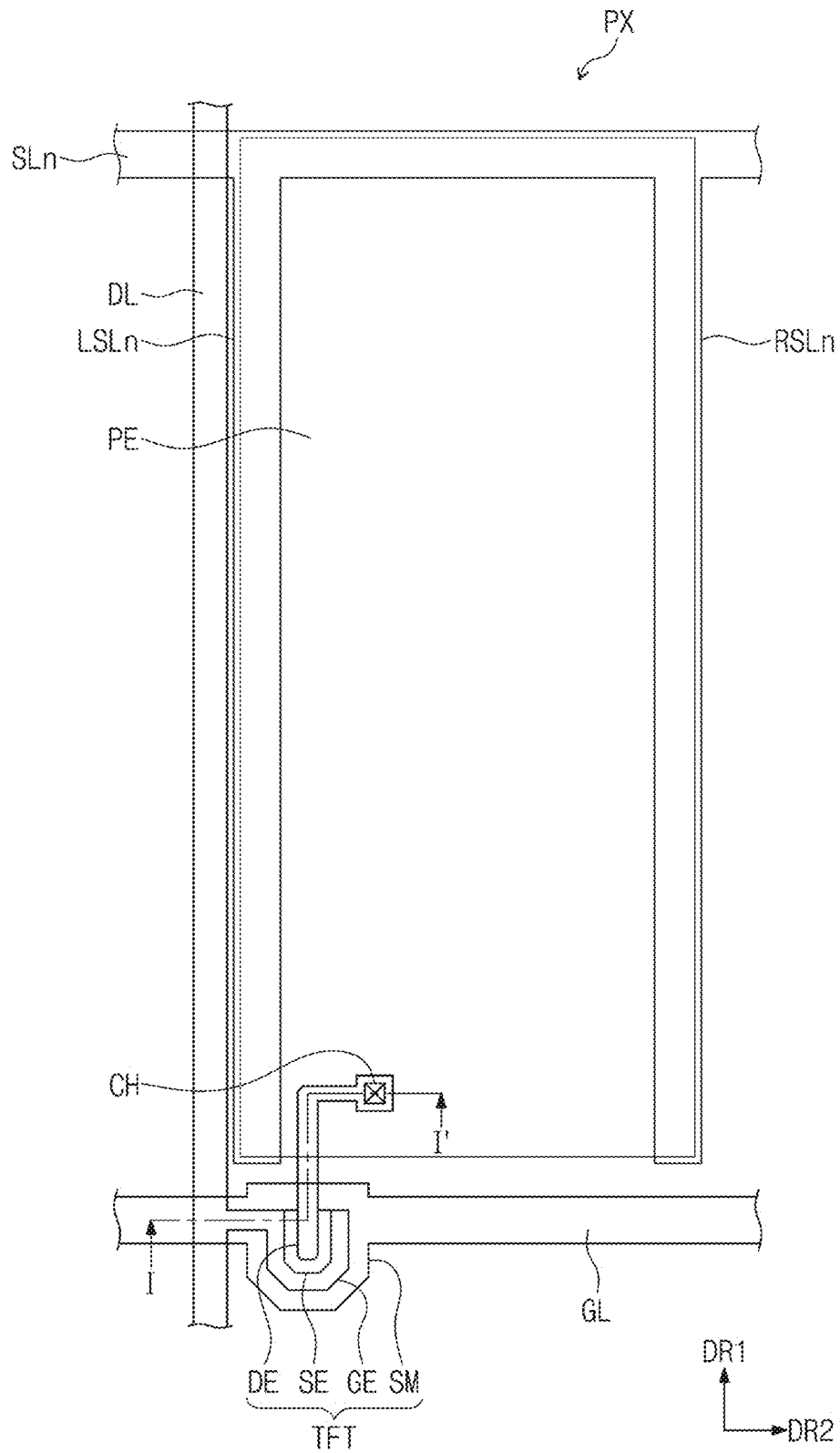
FIG. 2 is a plan view showing one pixel of a display device including an array substrate according to an embodiment of the inventive concepts.

FIG. 2 is a plan view showing one pixel structure of a display device including an array substrate manufactured by a method for manufacturing an array substrate of an embodiment. FIG. 3 is a cross-sectional view taken along line I-I' in FIG. 2. Hereinafter, an array substrate manufactured by a method for manufacturing an array substrate of an embodiment and a display device provided with the same will be explained referring to FIG. 2 and FIG. 3.

The method for manufacturing an array substrate of an embodiment may include a step of forming a gate line and a gate electrode connected with the gate line on a base substrate, a step of forming a data line which crosses the gate line in an insulation state, a source electrode connected with the data line, and a drain electrode separated from the source electrode, and a step of forming a pixel electrode connected with the drain electrode. In this case, the step of forming the source electrode and the drain electrode connected with the source electrode may include a step of forming a photosensitive layer pattern on a multilayer metal substrate including titanium and copper, a step of supplying an etchant composition on the multilayer metal substrate on which the photosensitive layer pattern is formed to form the source electrode and the drain electrode, and a step of removing the photosensitive layer pattern.

Meanwhile, the etchant composition in the method for manufacturing an array substrate of an embodiment may include a persulfate, a four-nitrogen ring compound, a two-chlorine compound, a fluorine compound, and water. The etchant composition used in the method for manufacturing a metal pattern of an embodiment may include a persulfate, a four-nitrogen ring compound, a two-chlorine compound, a fluorine compound, a hydrogen sulfate, a sulfonic acid compound, an antioxidant, an acidity regulator, a phosphate, a copper salt, and a remaining amount of water. The etchant composition used in the method for manufacturing a metal pattern of an embodiment may include from about 0.1 wt % to about 25 wt % of the persulfate, from about 0.5 wt % to about 1 wt % of the four-nitrogen ring compound, from about 0.5 wt % to about 2 wt % of the two-chlorine compound, from about 0.01 wt % to about 3 wt % of the fluorine compound, from about 0.05 wt % to about 8 wt % of the hydrogen sulfate, from about 0.1 wt % to about 10 wt % of the sulfonic acid compound, from about 0.001 wt % to about 3 wt % of the antioxidant, from about 0.1 wt % to about 0.9 wt % of the acidity regulator, from about 0.1 wt % to about 5 wt % of the phosphate compound, from about 0.01 wt % to about 2 wt % of the copper salt, and a remaining amount of the water.

The array substrate manufactured by the method for manufacturing an array substrate of an embodiment may be applied as a substrate including an electronic circuit for driving a display device. The kind of the display device is not specifically limited, but may include, for example, a liquid crystal display device, an organic light emitting display device, an electrophoretic display device, an electrowetting display device, a microelectromechanical system (MEMS) display device, etc.

Meanwhile, a liquid crystal display device is shown as an illustration among display devices in FIG. 2 and FIG. 3, but embodiments of the inventive concepts are not limited thereto. For example, the display device may be an organic light emitting display device. Meanwhile, in an embodiment of a display device having a plurality of pixels, each pixel is formed by the same structure, and for the convenience of explanation, one pixel is shown in FIG. 2 and FIG. 3.

Meanwhile, for the convenience of explanation, a pixel PX which is connected with one gate line among gate lines GL and one data line among data lines DL is shown in FIG. 2, but embodiments of the inventive concepts are not limited thereto. For example, one gate line and one data line may be connected with a plurality of pixels, and a plurality of gate lines and a plurality of data lines may be connected with one pixel.

Referring to FIG. 2 and FIG. 3, a display device DD may include an array substrate SUB1 provided with a pixel PX, an opposite substrate SUB2 which is opposite to the array substrate SUB1, and a liquid crystal layer LC disposed between the array substrate SUB1 and the opposite substrate SUB2.

To explain referring to FIG. 2 and FIG. 3, the gate line GL is extended in a second directional axis DR2 and formed. The gate line GL may be formed on the first base substrate BS1. The data line DL may be extended in a first directional axis DR1 which is orthogonal to the gate line GL and provided.

Each of the pixels PX includes a thin film transistor TFT, a pixel electrode PE connected with the thin film transistor TFT, and a storage electrode part. The thin film transistor TFT includes a gate electrode GE, a gate insulating layer GI, a semiconductor pattern SM, a source electrode SE, and a drain electrode DE. The storage electrode part may further include a storage line SLn extended in a second directional axis DR2, and a first branched electrode LSLn and a second branched electrode RSLn, which are branched from the storage line SLn and extended in a first directional axis DR1.

The gate electrode GE may be protruded from the gate line GL or provided on a partial region of the gate line GL. The gate electrode GE may be formed using a metal. The gate electrode GE may be formed using nickel, chromium, molybdenum, aluminum, titanium, copper, tungsten, or an alloy including the same. The gate electrode GE may be formed as a single layer or a multilayer using a metal. For example, the gate electrode GE may be a triple layer of molybdenum, aluminum, and molybdenum, stacked in order, or a double layer of titanium and copper, stacked in order. Also, the gate electrode GE may be a single layer formed using an alloy of titanium and copper.

The semiconductor pattern SM is provided on the gate insulating layer GI. The semiconductor pattern SM is provided on the gate electrode GE with the gate insulating layer GI disposed therebetween. The semiconductor pattern SM is partially overlapped with the gate electrode GE. The semiconductor pattern SM includes an active pattern (not shown) provided on the gate insulating layer GI and an ohmic contact layer (not shown) formed on the active pattern. The active pattern may be formed using an amorphous silicon thin film, and the ohmic contact layer (not shown) may be formed using an n+ amorphous silicon thin film. The ohmic contact layer (not shown) makes an ohmic contact between the active pattern, and the source electrode SE and the drain electrode DE, respectively.

The source electrode SE is branched from the data lines DL and provided. The source electrode SE is formed on the ohmic contact layer (not shown) and is partially overlapped with the gate electrode GE. The data line DL may be disposed on the gate insulating layer GI, where the semiconductor pattern SM is not disposed.

The drain electrode DE is separated from the source electrode SE with the semiconductor pattern SM disposed therebetween and provided. The drain electrode DE is formed on the ohmic contact layer (not shown) and is partially overlapped with the gate electrode GE.

In an embodiment, the source electrode SE and the drain electrode DE may be formed as a multilayer of a metal layer including copper and a metal layer including titanium. That is, the source electrode SE and the drain electrode DE may be a double layer metal pattern of a titanium metal pattern and a copper metal pattern, which are formed by etching a titanium metal layer and a copper metal layer, which are stacked in order. However, embodiments of the inventive concepts are not limited thereto. For example, the source electrode SE and the drain electrode DE may be a metal pattern of a single layer formed using an alloy of titanium and copper, or a multilayer metal pattern which is obtained by stacking three or more layers of a titanium metal pattern and a copper metal pattern.

In an embodiment, the source electrode SE and the drain electrode DE may be formed by patterning by an etching process using the above-described etchant composition of an embodiment. In the method for manufacturing an array substrate of an embodiment, using the etchant composition of an embodiment, the metal pattern may be formed to have a small CD skew value and a small taper angle during patterning a double layer of a titanium metal layer and a copper metal layer, so that the source electrode SE and the drain electrode DE may have an excellent taper profile.

In addition, in the method for manufacturing an array substrate of an embodiment, the etchant composition of an embodiment may minimize the damage of the semiconductor pattern SM due to the etching process of the source electrode SE and the drain electrode DE, and may improve the step coverage of an insulating layer PSV or a pixel electrode PE formed on the source electrode SE and the drain electrode DE.

According to the etching process using the etchant composition of an embodiment, the upper surface of the semiconductor pattern SM between the source electrode SE and the drain electrode DE is exposed, and according to the application of the voltage to the gate electrode GE, a channel part forming a conductive channel may be formed between the source electrode SE and the drain electrode DE. The source electrode SE and the drain electrode DE are overlapped with a portion of the semiconductor pattern SM in a region except for the separately formed channel part between the source electrode SE and the drain electrode DE.

The insulating layer PSV may cover the source electrode SE, the drain electrode DE, the channel part, and the gate insulating layer GI, and may have a contact hole CH which partially exposes the drain electrode DE. The insulating layer PSV may include, for example, silicon nitride or silicon oxide.

The pixel electrode PE is connected with the drain electrode DE via the contact hole CH formed in the insulating layer PSV. The pixel electrode PE is formed using a transparent conductive material. Particularly, the pixel electrode PE is formed using a transparent conductive oxide. The transparent conductive oxide may be indium tin oxide (ITO), indium zinc oxide (IZO), indium tin zinc oxide (ITZO), etc.

That is, the array substrate SUB1 may include the thin film transistor TFT, the insulating layer PSV, and the pixel electrode PE formed on the first base substrate BS1. Meanwhile, though not shown in the drawings, the array substrate SUB1 may further include an alignment layer (not shown) formed on the pixel electrode PE.

The opposite substrate SUB2 may be disposed to opposite the array substrate SUB1, and may include a second base substrate BS2, a color filter CF disposed under the second base substrate BS2, a light blocking part BM for blocking light, disposed between the color filters CF which realize different colors, and a common electrode CE which forms an electric field with the pixel electrode PE. Meanwhile, though not shown in the drawings, an alignment layer (not shown) may be further disposed under the common electrode CE.

In the method for manufacturing an array substrate of an embodiment, a source electrode and a drain electrode may be formed so as to have a small CD skew value and a small taper angle and to form an excellent metal pattern by using the etchant composition of an embodiment, including a persulfate, a four-nitrogen ring compound, a two-chlorine compound, a fluorine compound, and water.

Examples

Hereinafter, the etching properties of the etchant composition of an embodiment and a metal pattern manufactured using the same will be particularly explained referring to examples and comparative examples. However, the etchant compositions and metal patterns formed using the same in the examples are only illustrations, and the examples do not limit the scope of embodiments.

(Preparation of Etchant Composition)

The etchant compositions according to Example 1 to Example 5 and the etchant compositions according to Comparative Example 1 to Comparative Example 21 were prepared according to the configurations suggested in Table 2 below. The unit representing the amount of each component in Table 2 represents wt % with respect to 100 wt % of the total weight of the etchant composition. In Table 2, with respect to 100 wt % of the total weight of the etchant composition, the remaining amount corresponds to water.

TABLE 2

| | Persulfate | Four-nitrogen ring compound | Two-chlorine compound | Fluorine compound | Hydrogen sulfate | Sulfonic acid compound 1 | Sulfonic acid compound 2 | Antioxidant | Phosphate | Copper salt | Acidity regulator |
|---|---|---|---|---|---|---|---|---|---|---|---|
| Example 1 | 10 | 1 | 0.5 | 0.4 | 1 | 4 | 1 | 0.5 | 0.5 | 0.2 | 0.7 |
| Example 2 | 8 | 0.5 | 2 | 0.5 | 4 | 2 | 1 | 0.5 | 0.5 | 0.2 | 0.3 |
| Example 3 | 8 | 0.5 | 1.2 | 0.5 | 1 | 1 | 1 | 0.3 | 0.5 | 0.15 | 0.9 |
| Example 4 | 10 | 0.7 | 1 | 0.45 | 1 | 3 | 5 | 0.3 | 0.2 | 0.15 | 0.5 |
| Example 5 | 10 | 0.7 | 1 | 0.45 | 1 | 3 | 5 | 0.3 | 0.2 | 0.15 | 0.1 |
| Comparative Example 1 | 10 | 0.7 | 0.3 | 0.45 | 1 | 3 | 5 | 0.3 | 0.2 | 0.15 | 0.5 |
| Comparative Example 2 | 10 | 0.7 | 2.9 | 0.45 | 1 | 3 | 5 | 0.3 | 0.2 | 0.15 | 0.5 |
| Comparative Example 3 | 10 | 0.7 | 1 | 0.45 | 1 | 0.05 | 0 | 0.3 | 0.2 | 0.15 | 0.5 |
| Comparative Example 4 | 10 | 0.7 | 1 | 0.45 | 1 | 6 | 5 | 0.3 | 0.2 | 0.15 | 0.5 |
| Comparative Example 5 | 10 | 0.7 | 1 | 0.45 | 0 | 3 | 5 | 0.3 | 0.2 | 0.15 | 0.5 |
| Comparative Example 6 | 10 | 0.7 | 1 | 0.45 | 1 | 3 | 5 | 0 | 0.2 | 0.15 | 0.5 |
| Comparative Example 7 | 10 | 0.7 | 1 | 0.45 | 1 | 3 | 5 | 0.3 | 0 | 0.15 | 0.5 |
| Comparative Example 8 | 10 | 0.7 | 1 | 0.45 | 1 | 3 | 5 | 0.3 | 0.2 | 0 | 0.5 |
| Comparative Example 9 | 8 | 0.5 | 1.2 | 0.5 | 1 | 1 | 1 | 0.3 | 0.5 | 0.15 | 0 |
| Comparative Example 10 | 0 | 0.7 | 1 | 0.45 | 1 | 3 | 5 | 0.3 | 0.2 | 0.15 | 0.5 |
| Comparative Example 11 | 30 | 0.7 | 1 | 0.45 | 1 | 3 | 5 | 0.3 | 0.2 | 0.15 | 0.5 |
| Comparative Example 12 | 10 | 0.7 | 1 | 0.45 | 10 | 3 | 5 | 0.3 | 0.2 | 0.15 | 0.5 |
| Comparative Example 13 | 10 | 0.7 | 1 | 0 | 1 | 3 | 5 | 0.3 | 0.2 | 0.15 | 0.5 |
| Comparative Example 14 | 10 | 0.7 | 1 | 4 | 1 | 3 | 5 | 0.3 | 0.2 | 0.15 | 0.5 |
| Comparative Example 15 | 10 | 0.2 | 1 | 0.45 | 1 | 3 | 5 | 0.3 | 0.2 | 0.15 | 0.5 |
| Comparative Example 16 | 10 | 1.5 | 1 | 0.45 | 1 | 3 | 5 | 0.3 | 0.2 | 0.15 | 0.5 |
| Comparative Example 17 | 10 | 0.7 | 1 | 0.45 | 1 | 12 | 5 | 0.3 | 0.2 | 0.15 | 0.5 |
| Comparative Example 18 | 10 | 0.7 | 1 | 0.45 | 1 | 3 | 5 | 4 | 0.2 | 0.15 | 0.5 |
| Comparative Example 19 | 10 | 0.7 | 1 | 0.45 | 1 | 3 | 5 | 0.3 | 7 | 0.15 | 0.5 |
| Comparative Example 20 | 10 | 0.7 | 1 | 0.45 | 1 | 3 | 5 | 0.3 | 0.2 | 2.5 | 0.5 |
| Comparative Example 21 | 10 | 0.7 | 1 | 0.45 | 1 | 3 | 5 | 0.3 | 0.2 | 0.15 | 1.5 |

In the Examples and Comparative Examples suggested in Table 2, ammonium persulfate was used as the persulfate, aminotetrazole was used as the four-nitrogen ring compound, magnesium chloride was used as the two-chlorine compound, ammonium bifluoride was used as the fluorine compound, sodium hydrogen sulfate was used as the hydrogen sulfate, methanesulfonic acid (sulfonic acid compound 1) and sulfamic acid (sulfonic acid compound 2) were used as the sulfonic acid compound, ascorbic acid was used as the antioxidant, monosodium phosphate was used as the phosphate, copper sulfate was used as the copper salt, and nitric acid was used as the acidity regulator.

The etchant compositions of Example 1 to Example 5, suggested in Table 2, correspond to cases including from about 0.1 wt % to about 25 wt % of the persulfate, from about 0.5 wt % to about 1 wt % of the four-nitrogen ring compound, from about 0.5 wt % to about 2 wt % of the two-chlorine compound, from about 0.01 wt % to about 3 wt % of the fluorine compound, from about 0.05 wt % to about 8 wt % of the hydrogen sulfate, from about 0.1 wt % to about 10 wt % of the sulfonic acid compound, from about 0.001 wt % to about 3 wt % of the antioxidant, from about 0.1 wt % to about 0.9 wt % of the acidity regulator, from about 0.1 wt % to about 5 wt % of the phosphate compound, and from about 0.01 wt % to about 2 wt % of the copper salt compound. In addition, in the etchant compositions of Example 1 to Example 5, suggested in Table 2, the weight ratio of the four-nitrogen ring compound and the two-chlorine compound fulfills a range of from about 1:0.5 to about 1:4.

In comparison, Comparative Example 1 and Comparative Example 2 correspond to cases where the weight ratios of the four-nitrogen ring compound and the two-chlorine compound are less than about 1:0.5 and greater than about 1:5, respectively. Comparative Example 3 and Comparative Example 4 correspond to cases where the weight ratios of the sulfonic acid compounds based on the total weight of the etchant composition are less than about 0.1 wt % and greater than about 10 wt %, respectively. In addition, Comparative Example 5 corresponds to an etchant composition not including a hydrogen sulfate, Comparative Example 6 does not include an antioxidant, Comparative Example 7 does not include a phosphate, and Comparative Example 8 and Comparative Example 9 correspond to etchant compositions where a copper salt and an acidity regulator are not included, respectively. In addition, Comparative Example 10 and Comparative Example 11 correspond to cases where the weight ratios of the persulfate based on the total weight of the etchant composition are less than about 0.1 wt % and greater than about 25 wt %, respectively, Comparative Example 12 corresponds to a case where the weight ratio of the hydrogen sulfate based on the total weight of the etchant composition is greater than about 8 wt %, Comparative Example 13 and Comparative Example 14 correspond to cases where the weight ratios of the fluorine compound based on the total weight of the etchant composition are less than about 0.01 wt % and greater than about 3 wt %, respectively, Comparative Example 15 and Comparative Example 16 correspond to cases where the weight ratios of the four-nitrogen ring compound based on the total weight of the etchant composition are less than about 0.5 wt % and greater than about 1 wt %, respectively, Comparative Example 17 corresponds to a case where the amount of the sulfonic acid compound 1 is greater than the given amount range, Comparative Example 18 corresponds to a case where the amount of the antioxidant is greater than the given amount range, Comparative Example 19 corresponds to a case where the amount of the phosphate is greater than the given amount range, Comparative Example 20 corresponds to a case where the amount of the copper salt is greater than the given amount range, and Comparative Example 21 corresponds to a case where the amount of the acidity regulator is greater than the given amount range.

(Manufacture and Evaluation of Metal Pattern)

Etching test with respect to a double layer of a titanium metal layer and a copper metal layer was carried out using the etchant compositions suggested in Table 2. For the etching test, with respect to a double layer of a titanium metal layer of about 200 Å and a copper metal layer of about 6,000 Å, each etchant composition of the Examples and the Comparative Examples was supplied at temperature conditions of about 28° C., and an etching rate, a one side CD skew, a taper angle, and the generation or not of a precipitate were evaluated at a point of 100% overetching, which was twice or more of the end point detection time (EPD time) when a titanium/copper double layer was completely etched.

In Table 3 below, the acidity of each etchant composition of the Examples and the Comparative Examples, and an etching rate, a one side CD skew, a taper angle, and the generation or not of a precipitate during the etching process of a double layer using each etchant composition of the Examples and the Comparative Examples, are shown. Meanwhile, "Cu 0 ppm" represents a case where an etchant composition was initially used, and "Cu 1000 ppm" corresponds to a case where an etching test was performed by increasing the copper concentration of an etchant composition. With respect to the generation of a precipitate, "X" corresponds to a case where the precipitate was not generated, and "O" corresponds to a case where the precipitate was generated.

Figure 4:
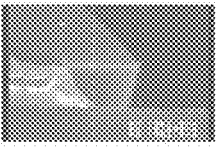
FIG. 4 illustrates electron scanning microscopic images on metal patterns of embodiments.
Figure 5:
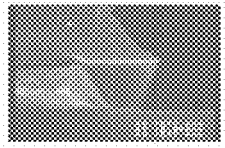
FIG. 5 illustrates electron scanning microscopic images on metal patterns of comparative examples.

In addition, FIG. 4 illustrates electron scanning microscopic images of cross-sections after performing an etching process for Example 1 to Example 4, and FIG. 5 illustrates electron scanning microscopic images of cross-sections after performing an etching process for Comparative Example 1 to Comparative Example 9. Meanwhile, in FIG. 4 and FIG. 5, "Cu 0 ppm" and "Cu 1000 ppm" correspond to a case where an etchant composition was initially used and a case where the etchant composition was reused, respectively, as described above.

TABLE 3

|  | Acidity | E/R (Å/sec) | Cu 0 ppm CD skew (μm) | Cu 1000 ppm CD skew (μm) | Taper angle (°) | Precipitate generation |
|---|---|---|---|---|---|---|
| Example 1 | 5.8 | 250 | 0.58 | 0.58 | 58 | X |
| Example 2 | 4.2 | 240 | 0.59 | 0.59 | 57 | X |
| Example 3 | 2.4 | 240 | 0.57 | 0.58 | 58 | X |
| Example 4 | 4.4 | 222 | 0.56 | 0.56 | 56 | X |
| Example 5 | 3.8 | 240 | 0.55 | 0.51 | 55 | X |
| Comparative Example 1 | 4.1 | 207 | 0.58 | 0.56 | 58 | O |
| Comparative Example 2 | 4.8 | 273 | 0.58 | 0.58 | 66 | O |
| Comparative Example 3 | 1.9 | 250 | 0.56 | 0.56 | 60 | O |
| Comparative | 6.2 | 267 | 0.56 | 0.56 | 60 | O |

TABLE 3-continued

| | Acidity | E/R (Å/sec) | Cu 0 ppm CD skew (μm) | Cu 1000 ppm CD skew (μm) | Taper angle (°) | Precipitate generation |
|---|---|---|---|---|---|---|
| Example 4 | | | | | | |
| Comparative Example 5 | 4.0 | 222 | 0.57 | 0.57 | 60 | X |
| Comparative Example 6 | 4.3 | 231 | 0.58 | 0.58 | 60 | ○ |
| Comparative Example 7 | 4.4 | 240 | 0.72 | 0.72 | 65 | X |
| Comparative Example 8 | 4.4 | 240 | 0.49 | 0.59 | 58 | X |
| Comparative Example 9 | 1.9 | 222 | 0.58 | 0.58 | 58 | ○ |
| Comparative Example 10 | 4 | | Top copper layer unetched | | | |
| Comparative Example 11 | 4.9 | 320 | Etching ratio (high E/R and unnecessary) | | | X |
| Comparative Example 12 | 5.5 | 276 | Etching ratio (high E/R and unnecessary) | | | X |
| Comparative Example 13 | 4.3 | | Bottom titanium layer unetched | | | |
| Comparative Example 14 | 4.6 | 170 | Etching ratio (low E/R and unnecessary) | | | X |
| Comparative Example 15 | 4.4 | 308 | Etching ratio (low E/R and unnecessary) | | | X |
| Comparative Example 16 | 4.4 | 159 | Etching ratio (low E/R and unnecessary) | | | X |
| Comparative Example 17 | 9.1 | 336 | Etching ratio (high E/R and unnecessary) | | | ○ |
| Comparative Example 18 | 4.8 | 178 | Etching ratio (low E/R and unnecessary) | | | X |
| Comparative Example 19 | 4.4 | 188 | Etching ratio (low E/R and unnecessary) | | | X |
| Comparative Example 20 | 4.4 | 170 | Etching ratio (low E/R and unnecessary) | | | X |
| Comparative Example 21 | 5.4 | 292 | Etching ratio (high E/R and unnecessary) | | | X |

Referring to Table 3, it could be confirmed that the etchant compositions used in Example 1 to Example 5 satisfied an acidity range of about 2.0 to about 6.0. In comparison, it could be found that Comparative Example 3 and Comparative Example 9 showed the acidity of less than about 2.0, and Comparative Example 4 showed an acidity value of greater than about 6.0. In addition, Comparative Examples 3, 4 and 9 showed different acidity value ranges when compared with Example 1 to Example 5, and the generation of the precipitate was found.

In Comparative Example 3, the amount included of the sulfonic acid compound was less than about 0.1 wt %, and the acidity of the etchant composition was low and about 1.9. Accordingly, the production of the precipitate was confirmed.

In addition, the precipitate was produced in Comparative Example 1 and Comparative Example 2, and this is thought that the weight ratio of the four-nitrogen ring compound and the two-chlorine compound of the etchant compositions used in Comparative Example 1 and Comparative Example 2 deviated from a range of about 1:0.5 to about 1:4.

In addition, in case of Comparative Example 6, an antioxidant was not included in the etchant composition, and it was confirmed in this case that the precipitate was produced when compared with the Examples.

In case of Comparative Example 8, excellent etching rate was shown, and the production of a precipitate was not found, but it could be confirmed that the one side CD skew value was increased at "Cu 1000 ppm" when compared with "Cu 0 ppm".

Comparative Example 10 to Comparative Example 21 corresponded to cases where basic etching quality was inferior and an etching rate was high, or on the contrary, the etching rate was low and etching productivity was not good. The etching rate was about 200-275 Å/sec and was though an appropriate degree.

Comparative Example 10 corresponded to a case where a persulfate was not included, and the etching of a copper layer was difficult. Comparative Example 11 corresponded to a case where the amount of the persulfate was greater than the given amount range, and the etching rate of a copper layer was increased and overetching was generated.

Comparative Example 12 corresponded to a case where the amount of the hydrogen sulfate was greater than the given range, and the etching rate of a copper layer was increased and overetching was generated.

Comparative Example 13 corresponded to a case where the fluorine compound was not included, and a bottom titanium layer could not be etched and the formation of a wiring was incompletely performed. Comparative Example 14 corresponded to a case where the amount of the fluorine compound was greater than the given range, and due to the increase of the amount of ammonium, the etching rate of copper was low, and due to the increase of the amount of fluorine, the damage of a glass substrate increased and the reuse thereof became difficult.

Comparative Example 15 corresponded to a case where the amount of the four-nitrogen ring compound was less than the given range, and the etching rate of a copper layer was increased and overetching was generated. Comparative Example 16 corresponded to a case where the amount of the four-nitrogen ring compound was greater than the given range, and the etching rate of a copper layer was low, a production takt time was increased, and production efficiency was reduced.

Comparative Example 17 corresponded to a case where the amount of the sulfonic acid compound was greater than the given range, and the etching rate of a copper layer was increased and overetching was generated.

Comparative Example 18 corresponded to a case where the amount of the antioxidant was greater than the given range, and the etching rate of a copper layer was low, a product takt time was increased, and production efficiency was reduced.

Comparative Example 19 corresponded to a case where the amount of the phosphate was greater than the given range, and the etching rates of a copper and titanium layer were low, a product takt time was increased, and production efficiency was reduced.

Comparative Example 20 corresponded to a case where the amount of the copper salt was greater than the given range, and the concentration of copper was increased, the decomposition of the persulfate was increased, and thus, the etching rate of a copper layer was low, a product takt time was increased, and production efficiency was reduced.

Comparative Example 21 corresponded to a case where the amount of the acidity regulator was greater than the given range, and the etching rate of a copper layer was increased and overetching was generated.

Referring to Table 3, FIG. 4 and FIG. 5, in Example 1 to Example 5, the one side CD skew values were less than about 0.6 μm for both cases of "Cu 0 ppm" and "Cu 1000 ppm" and were favorable values. That is, from the maintenance of etching quality in case of reusing the etchant composition, it could be confirmed that the stability of the etchant compositions of the Examples was excellent. In addition, the taper angle was small and less than about 60° for all Example 1 to Example 5, and it could be confirmed that the formation of the metal pattern of the titanium/copper double layer was excellent.

It could be confirmed that Example 1 to Example 5 showed excellent properties in all items including the etching rate, the one side CD skew, the taper angle, and the generation or not of a precipitate.

Figure 6A:
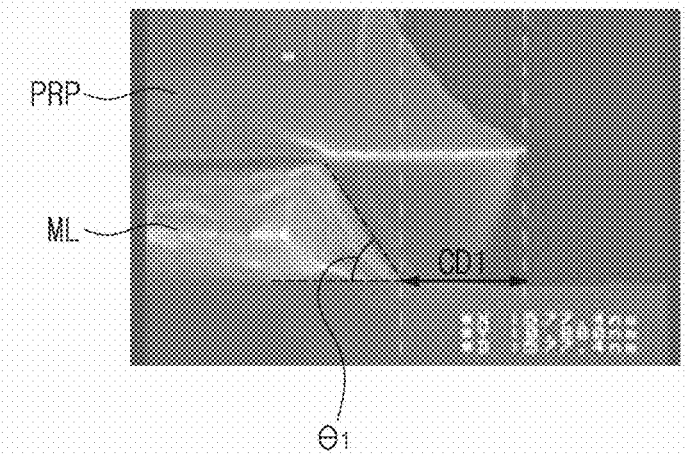
FIG. 6A and FIG. 6B illustrate electron scanning microscopic images on metal patterns of an example and a comparative example, respectively.
Figure 6B:
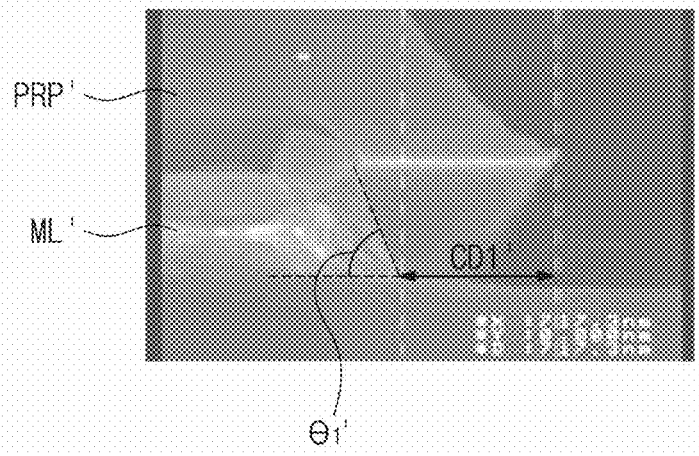

FIG. 6A and FIG. 6B illustrate electron scanning microscopic images after an etching process in Example 2 and Comparative Example 7, respectively. FIG. 6A and FIG. 6B illustrate images on cross-sections of metal patterns ML and ML' formed under photosensitive layer patterns PRP and PRP'. When comparing FIG. 6A with FIG. 6B, it was confirmed that the one side CD skew CD1 of the metal pattern ML of the Example was smaller than the one side CD skew CD1' of the metal pattern ML' of the Comparative Example, and the taper angle ($\theta_1$) of the metal pattern ML of the Example was smaller than the taper angle ($\theta_1$') of the metal pattern ML' of the Comparative Example. From the results, it was confirmed that an excellent metal pattern having a smaller CD skew value and a smaller taper angle was formed in the Example when compared with the Comparative Example.

The etchant composition of an embodiment may be used for etching a multilayer metal substrate of a titanium metal layer and a copper metal layer in a batch process, and may keep stable etching properties though repeatedly used. In addition, the etchant composition of an embodiment may keep a constant etching rate, may keep CD skew and a taper angle which are the etching properties of a metal pattern to a constant degree or less, and may restrain the production of a precipitate. In addition, a metal pattern and an array substrate manufactured by using the etchant composition of an embodiment were found to have excellent taper profiles.

An embodiment may provide an etchant composition which has excellent storage stability and improves the etching properties of a multilayer metal substrate including copper.

An embodiment may provide a method for manufacturing a metal pattern, which improves productivity and wiring defects such as short.

An embodiment may provide a method for manufacturing an array substrate in which a multilayer pattern, etc. have an appropriate taper angle, and the step coverage of a metal layer which is stacked on the multilayer pattern is excellent.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An etchant composition, consisting of:
a persulfate;
a four-nitrogen ring compound;
a two-chlorine compound;
a fluorine compound;
a hydrogen sulfate;
a first sulfonic acid compound;
a second sulfonic acid compound;
an antioxidant;
a phosphate;
a copper salt;
an acidity regulator; and
water.

2. The etchant composition of claim 1,
wherein a weight ratio of the four-nitrogen ring compound and the two-chlorine compound is from about 1:0.5 to about 1:4.

3. The etchant composition of claim 1,
comprising, based on a total weight of the etchant composition:
from about 0.1 wt % to about 25 wt % of the persulfate;
from about 0.5 wt % to about 1 wt % of the four-nitrogen ring compound;
from about 0.5 wt % to about 2 wt % of the two-chlorine compound;
from about 0.01 wt % to about 3 wt % of the fluorine compound;
from about 0.05 wt % to about 8 wt % of the hydrogen sulfate;
from about 0.1 wt % to about 10 wt % of a sulfonic acid compound including the first sulfonic acid compound and the second sulfonic acid compound;
from about 0.001 wt % to about 3 wt % of the antioxidant;
from about 0.1 wt % to about 0.9 wt % of the acidity regulator;
from about 0.1 wt % to about 5 wt % of the phosphate;
from about 0.01 wt % to about 2 wt % of the copper salt, and
a remaining amount of the water.

4. The etchant composition of claim 3, wherein the sulfonic acid compound comprises at least one of methane sulfonic acid, benzene sulfonic acid, p-toluene sulfonic acid, ammonium sulfonic acid, amido sulfonic acid, a cyclic sulfonic acid compound, or a hydrocarbon-based sulfonic acid compound.

5. The etchant composition of claim 1, wherein an acidity of the etchant composition is from about 2.0 to about 6.0.

6. The etchant composition of claim 1, wherein the persulfate comprises at least one of potassium persulfate ($K_2S_2O_8$), sodium persulfate ($Na_2S_2O_8$), or ammonium persulfate (($NH_4)_2S_2O_8$).

7. The etchant composition of claim 1, wherein the four nitrogen ring compound comprises at least one of aminotetrazole, aminotetrazole of potassium salt, or methyltetrazole.

8. The etchant composition of claim 1, wherein the two-chlorine compound comprises at least one of magnesium chloride ($MgCl_2$), calcium chloride ($CaCl_2$), or copper chloride ($CuCl_2$).

9. The etchant composition of claim 1, wherein the fluorine compound comprises at least one of hydrogen fluoride (HF), ammonium fluoride ($NH_4F$), potassium fluoride (KF), sodium fluoride (NaF), ammonium bifluoride ($F_2H_5N$), potassium bifluoride ($KHF_2$), or sodium bifluoride ($NaHF_2$).

10. The etchant composition of claim 1, wherein the hydrogen sulfate comprises at least one of ammonium hydrogen sulfate ($NH_4HSO_4$), lithium hydrogen sulfate ($LiHSO_4$), potassium hydrogen sulfate ($KHSO_4$), or sodium hydrogen sulfate ($NaHSO_4$).

11. The etchant composition of claim 1, wherein the etchant composition is configured to etch a multilayer comprising a titanium metal layer and a copper metal layer to form a multilayer metal pattern.

\* \* \* \* \*